United States Patent [19]
Hurt

[11] Patent Number: 5,838,020
[45] Date of Patent: Nov. 17, 1998

[54] METHOD AND APPARATUS FOR STORING DATA USING SPIN-POLARIZED ELECTRONS

[75] Inventor: Thomas D. Hurt, Chantilly, Va.

[73] Assignee: TeraStore, Inc., Chantilly, Va.

[21] Appl. No.: 641,418

[22] Filed: May 1, 1996

Related U.S. Application Data

[63] Continuation of Ser. No. 311,738, Sep. 23, 1994, Pat. No. 5,546,337, which is a continuation-in-part of Ser. No. 188,828, Jan. 31, 1994, Pat. No. 5,446,687.

[51] Int. Cl.$^6$ .................................................. H01L 29/06
[52] U.S. Cl. ............................................. 257/10; 331/309
[58] Field of Search .................................. 365/118, 121; 257/10; 313/309, 310, 336

[56] References Cited

U.S. PATENT DOCUMENTS

| | | | |
|---|---|---|---|
| 2,952,503 | 9/1960 | Becker | 346/74 |
| 3,094,699 | 6/1963 | Supernowicz | 346/74 |
| 3,170,083 | 2/1965 | Newberry | 315/31 |
| 3,573,753 | 4/1971 | Skelly et al. | 340/173 |
| 3,641,510 | 2/1972 | Chen | 340/173 |
| 3,693,003 | 9/1972 | Sigsbee et al. | 313/66 |
| 3,710,352 | 1/1973 | Smith et al. | 340/173 |
| 3,750,117 | 7/1973 | Chen et al. | 340/173 |

(List continued on next page.)

FOREIGN PATENT DOCUMENTS

| | | |
|---|---|---|
| 0 186 813 | 7/1986 | European Pat. Off. . |
| 0 210 855 | 4/1987 | European Pat. Off. . |
| 0 289 221 | 11/1988 | European Pat. Off. . |
| 1 173 533 | 7/1964 | Germany . |
| 37 24 617 | 1/1988 | Germany . |
| 40 08 022 | 9/1991 | Germany . |
| 53-70 637 | 6/1978 | Japan . |
| 652 510 | 11/1985 | Switzerland . |
| 79109894 | 4/1992 | Taiwan . |

(List continued on next page.)

OTHER PUBLICATIONS

H.J. Kump et al., "Magnetic Information Storage Apparatus", IBM Tech. Disclosure Bulletin, vol. 9, No. 11, Apr. 1967, p. 1601.

M.W.J. Prins et al.; Spin–Dependent Transmission at Ferromagnet/Semi–Conductor Interfaces; Journal of Magnetism and Magnetic Materials 121 (1993); pp. 152–155.

(List continued on next page.)

Primary Examiner—David C. Nelms
Assistant Examiner—Hoai Ho
Attorney, Agent, or Firm—Finnegan, Henderson, Farabow, Garrett & Dunner, L.L.P.

[57] ABSTRACT

A data storage device including a substrate, a data storage layer on the substrate, and a spin-polarized electron source. The data storage layer comprises a fixed number of atomic layers of a magnetic material which provide the data storage layer with a magnetic anisotropy perpendicular to a surface of the data storage layer. A data magnetic field is created in the data storage layer. The data magnetic field is polarized either in a first direction corresponding to a first data value or in a second direction corresponding to a second data value. Data is stored in the data storage layer by providing a spin-polarized electron having an electron magnetic field with a direction of polarization corresponding to one of the first and the second data values, the electron having a wavelength "characteristic" of unpaired electrons in the data storage layer which cause the magnetic moment of the material, and directing the spin-polarized electron at the data magnetic field to impart the direction of polarization of the electron magnetic field to the data magnetic field. Data is read from the data storage layer by directing the spin-polarized electron at a second wavelength at the data magnetic field and detecting a deflection or attraction of the spin-polarized electron by the data magnetic field. Alternatively, data is read from the data storage layer by directing the spin-polarized electron at the data magnetic field so that the magnetic medium produces a secondary electron and then detecting certain characteristics of the secondary electron.

29 Claims, 12 Drawing Sheets

OTHER PUBLICATIONS

Sandip Dhara et al.; Magnetic Properties of Chemical Vapour Deposited Cobalt Doped Gamma Iron Oxide Thin Films; Jpn. J. Appln. Phys, vol. 31 (1992) Pt. 1, No. 12A; pp. 3853–3857.

R. Allenspach; Ultrathin Films; Magnetism on the Microscopic Scale; Journal of Magnetism and Magnetic Materials 129 (1994); pp. 160–185.

S. Andrieu et al.; FeIr (001) Superlattices: Growth Structure, and Magnetic Properties; Journal of Magnetism and Magnetic Materials vol. 121 (1993); pp. 30–33.

T.H.P. Chang et al.; A scanning Tunneling Microscope Controlled Field Emission Microprobe System; J. Vac. Sci. Technol. B9(2); Mar./Apr. 1991 pp. 438–443.

T.H.P. Chang et al.; Microminaturization of Electron Optical Systems; J. Vac. Sci. Technol. B8(6); Nov./Dec. 1990, pp. 1698–1703.

Yasutaro Uesaka et al; Micromagnetic Computation of Damping Constant Effect on Switching Mechanism of a Hexagonal Platelet Particle; Jpn J. Appl.; vol. 32 (1993) Pt., No. 3A; pp. 1101–1106.

C. Rau et al.; Layer–Dependent Magnetic Properties and Fe Surfaces Using Spin–Polarized Electron Emission Spectroscopy (SPEES); Journal of Magnetism and Magnetic Materials 121 (19930 pp. 163–166.

W.S. Meisburger et al.; Low–Voltage Electron–Optical System for the High–Speed Inspection of Integrated Circuits; J. Vac. Sci. Technol. B10 (6) Nov./Dec. 1992; pp. 2804–2808.

H. Itoh et al.; Cell Projection Column for High Speed Electron–Beam Lithography System; J. Vac. Sci. Technol. B10(6); Nov./Dec. 1992; pp. 2799–2803.

Y. Takahashi et al.; Electron Beam Lithography System With New Correction Techniques; J. Vac. Sci. Technol. B10(6); Nov./Dec. 1992; pp. 2794–2798.

M.A. McCord et al.; 100 kV Thermal Field Emission Electron Beam Lithograph Tool For High–Resolution X–ray Mask Pattern; J. Vax. Sci. Technol. B10(6); Nov./Dec. 1992; pp. 2764–2770.

Y. Sakitani et al.; Electron–Beam Cell–Projection Lithography System; J. Vac. Sci. Technol. B10(6); Nov./Dec. 1992; pp. 2759–2763.

Sun–Chul Shin; Co–Based Multilayer Films as Novel Magneto–Optical Recording Media; Applied Surface Science 65/66 (1993); pp. 110–117.

D.A. Crewe et al.; Micromachined Electrostatic Electron Source; J. Vac. Sci. Technol. B10(6); Nov./Dec. 1992; pp. 2754–2758.

F. Abboud et al.; Electron Beam Lithography Using MEBES IV; J. Vac. Sci. Technol. B10(6); Nov./Dec. 1992; pp. 2734–2742.

Tadashi Yogi et al.; Ultra High Density Media: Gigabit and Beyond; IEEE Transaction on Magnetics; vol. 29, No. 1; Jan. 1993; pp. 307–316.

Y. Uesaka et al.; Computer Simulation of Switching Fields and Magnetization States of Interacting Cubic Particles: Cases with Fields Applied Parallel to the Hard Axes; Journal of Magnetism and Magnetic Materials 123 (1993); pp. 337–358.

Jiye Ximen et al.; Electron Optical Properties and Aberrations of a Miniaturized Electron Beam System; J. Vac. Sci. Technol. vol. 10, No. 3; May/Jun. 1992; pp. 1197–1202.

Mark Johnson; Biopolar Spin Switch; Science, vol. 260; Apr. 16, 1993; pp. 320–3323.

T.H.P. Chang et al.; Arrayed Miniature Electron Beam Columns for High Throughout Sub–100 NM Lithography; J. Vac. Sci. Technol. B. vol. 10, No. 6; Nov./Dec. 1992; pp. 2743–2749.

L.P. Muray et al.; Performance Measurements of a 1–keV Electron–Beam Microcolumn; J. Vac. Sci. Technol. B, vol. 10, No. 6; Nov./Dec. 1992; pp. 2749–2753.

IBM Technical Disclosure Bulletin; Technology for Detecting Small Magnetic Domains and Beam Addressed Memory Therewith; Mar. 1978; pp. 4212–4215; vol. 20, No. 10.

*IBM Technical Disclosure Bulletin; Spin–Polarized Tunneling Storage Device* Sep. 1987; p. 1858, vol. 30, No. 4.

Patent Abstracts of Japan; vol. 12, No. 203 (P–715) & JP, A, 63 004444, Hitachi Ltd. Jan. 9, 1988 (See Abstract).

R. Wisendanger, "Spin–Polarized Scanning Tunneling Microscopy Gateway to Imaging and Modification of Surface–Spin Configurations at the Atomic Level", vol. 18, No. 1, (1994), pp. 4–14.

IBM Technical Disclosure Bulletin, "Spin–Polarized Tunneling Storage Device", vol. 30, No. 4, p. 1858, Sep. 1987.

IBM Technical Disclosure Bulletin, "Technology for Detecting Small Magnetic Domains and Beam Addressed Memory Therewith", vol. 20, No. 10 pp. 4212–4215, Mar. 1978.

U.S. PATENT DOCUMENTS

| Number | Date | Inventor | Class |
|---|---|---|---|
| 3,760,383 | 9/1973 | Wolfe et al. | 313/83 |
| 4,068,218 | 1/1978 | Likushi | 365/237 |
| 4,122,530 | 10/1978 | Smith et al. | 364/900 |
| 4,242,580 | 12/1980 | Becker et al. | 365/121 |
| 4,324,854 | 4/1982 | Beauchamp et al. | 430/296 |
| 4,424,264 | 1/1984 | Mamura et al. . | |
| 4,455,486 | 6/1984 | Rau | 250/306 |
| 4,534,016 | 8/1985 | Kirkpatrick et al. | 365/128 |
| 4,748,592 | 5/1988 | Nagao et al. | 365/113 |
| 4,823,177 | 4/1989 | Prinz et al. | 357/27 |
| 4,985,627 | 1/1991 | Gutierrez et al. | 250/306 |
| 5,116,693 | 5/1992 | Liu et al. | 428/694 |
| 5,122,663 | 6/1992 | Chang et al. | 250/310 |
| 5,134,605 | 7/1992 | Goldberg et al. | 369/101 |
| 5,138,174 | 8/1992 | Tang | 250/492 |
| 5,161,147 | 11/1992 | Goldberg et al. | 369/100 |
| 5,161,149 | 11/1992 | Potember et al. | 369/126 |
| 5,166,919 | 11/1992 | Eigler | 369/126 |
| 5,173,873 | 12/1992 | Wu et al. . | |
| 5,194,881 | 3/1993 | Hirt | 346/158 |
| 5,216,661 | 6/1993 | Potember et al. | 369/126 |
| 5,446,687 | 8/1995 | Hurt et al. . | |
| 5,550,426 | 8/1996 | Smith et al. | 257/10 |

FOREIGN PATENT DOCUMENTS

| | | |
|---|---|---|
| 1 426 895 | 3/1976 | United Kingdom . |
| 2 162 008 | 1/1986 | United Kingdom . |
| 2 234 842 | 2/1991 | United Kingdom . |
| WO88/01424 | 2/1988 | WIPO . |

METHOD AND APPARATUS FOR STORING DATA USING SPIN-POLARIZED ELECTRONS

This application is a continuation of application Ser. No. 08/311,738, filed Sep. 23, 1994, now U.S. Pat. No. 5,546,337; which application is a continuation-in-part of U.S. application of Thomas D. Hurt and Scott A. Halpine for DATA STORAGE MEDIUM FOR STORING DATA AS A POLARIZATION OF A DATA MAGNETIC FIELD AND METHOD AND APPARATUS USING SPIN-POLARIZED ELECTRONS FOR STORING THE DATA ONTO THE DATA STORAGE MEDIUM AND READING THE STORED DATA THEREFROM, filed Jan. 31, 1994, Ser. No. 08/188,828, now U.S. Pat. No. 5,446,687, the contents of which is herein incorporated by reference.

BACKGROUND OF THE INVENTION

1. Field of the Invention

The present invention relates to data storage and retrieval. More particularly, the present invention relates to a data storage medium and a method and apparatus for storing data onto the data storage medium and reading the stored data therefrom.

2. Description of the Related Art

Over the years, there has been an increasing need for high speed mass data storage devices. With the conversion from analog systems to digital systems and the increasing speed of processing demonstrated by current processor technology, the ability to quickly access large amounts of data is lagging behind demand. This is especially true in the scientific world for computer modeling and simulations, as well as in the consumer world for high definition television (HDTV), HDTV video records, compact disks, personal digital assistants (PDAs), personal communication assistants (PCAs), digital tape decks, and even such items as automobiles. Furthermore, the merging worlds of computers, multimedia, and communication will impact consumers through virtual reality, interactive television, voice recognition systems (vocally interactive), handwriting recognition systems, and integrated communications with entertainment systems, each of which will require high speed nonvolatile mass data storage.

Applying conventional lithographic techniques and incremental improvement processes to current memory technologies has resulted in incremental progress. This incremental progress will simply exacerbate the disparity between the increasing speed of processors and their capability to store and effectively utilize needed amounts of data.

SUMMARY OF THE INVENTION

Accordingly, the present invention is directed to a data storage medium and a method and apparatus for storing data onto the data storage medium and reading the stored data therefrom that substantially obviates one or more of the problems due to the limitations and disadvantages of the related art.

Features and advantages of the invention will be set forth in the description which follows, and in part will be apparent from the description, or may be learned by practice of the invention. The objectives and other advantages of the invention will be realized and attained by the method and apparatus particularly pointed out in the written description and claims thereof as well as the appended drawings.

To achieve these and other advantages and in accordance with the purpose of the invention, as embodied and broadly described, a data storage device comprises a member including a magnetic material; means for generating a beam of electrons, the beam electrons having a common magnetic polarization in one of a first direction and a second direction, the beam being directable at one of a plurality of portions of the member; means, responsive to an address signal, for directing the beam to a portion of the member corresponding to the address signal, and for controlling the wavelength of the beam electrons such that the portion of the member assumes a magnetic polarization corresponding to the magnetic polarization of the beam electrons; and means, responsive to the address signal, for detecting the polarization of a portion of the member corresponding to the address signal, by directing the beam at the portion.

According to another aspect of the invention, a method of operating a system including a member having a magnetic material, and a means for generating a beam of electrons, the beam electrons having a common magnetic polarization in one of a first direction and a second direction, the beam being directable at one of a plurality of portions of the member, the method comprises the steps of receiving an address signal; directing the beam to a portion of the member corresponding to the address signal and controlling the wavelength of the beam electrons such that the portion of the member assumes a magnetic polarization corresponding to the magnetic polarization of the beam electrons.

According to another aspect of the invention, a method of operating a system including a member having a magnetic material, and a means for generating a beam of electrons, the beam electrons having a common magnetic polarization in one of a first direction and a second direction, the beam being directable at one of a plurality of portions of the member, the method comprises the steps of receiving an address signal; directing the beam to a portion of the member corresponding to the address signal and controlling the wavelength of the beam electrons such that the portion of the member assumes a magnetic polarization corresponding to the magnetic polarization of the beam electrons; and subsequently, detecting the polarization of a portion of the member corresponding to the address signal, by directing the beam at the portion.

According to another aspect of the invention, a method of storing data as a direction of polarization in a magnetic material, the method comprises the steps of providing a spin-polarized electron having an electron magnetic field, the electron magnetic field having a direction of polarization corresponding to one of first and second data values, the electron having a wavelength characteristic of unpaired electrons that cause the magnetic moment of the magnetic material; and directing the spin-polarized electron, through an electrically nonconductive environment, at a portion of the magnetic material to impart the direction of polarization of the electron magnetic field to the portion.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate a presently preferred embodiment of the invention and, together with the description, serve to explain the principles of the invention. In the drawings.

DESCRIPTION OF THE PREFERRED EMBODIMENT

Reference will now be made in detail to the present preferred embodiment of the invention, an example of which is illustrated in the accompanying drawings.

Figure 1:
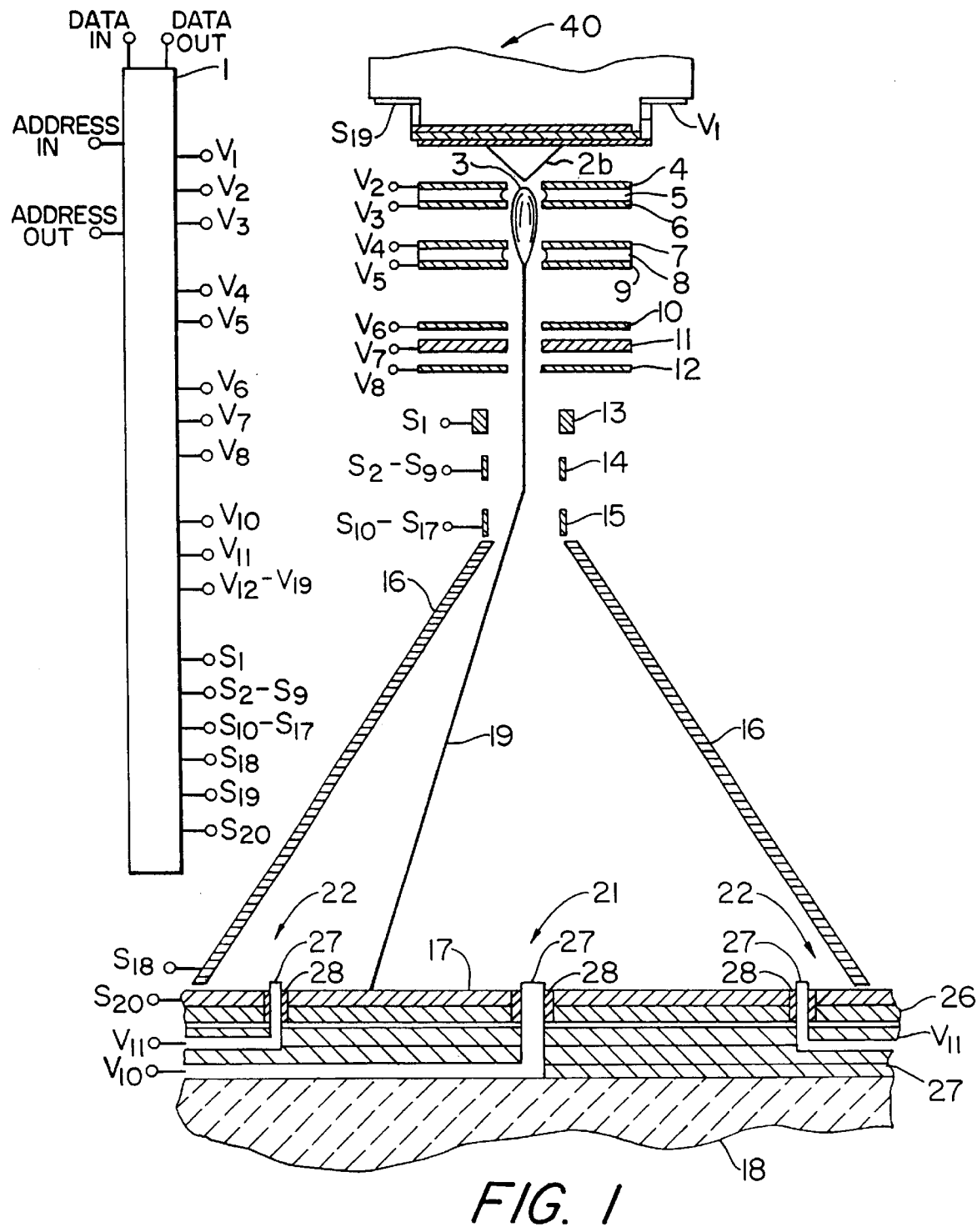
FIG. 1 is a cross-sectional view of data storage and retrieval device of the preferred embodiment of the present invention.

FIG. 1 illustrates an exemplary embodiment of a data storage and retrieval device of the present invention. The data storage and retrieval device includes a control unit 1, a spin-polarized electron source 40 having a tip 2b, an extractor 4, collimators 6, 7 and 9, electrostatic lenses 10, 11 and 12, and insulating elements 5 and 8. The data storage and retrieval device also includes further comprises a blanking element 13, coarse and fine microdeflectors 14 and 15, respectively, an electron detector 16, a data storage layer 17, and a substrate 18.

The control unit 1, includes a microprocessor or other control circuitry known in the art. The control unit 1 coordinates and sequences the various functions and operations performed by the data storage and retrieval device, as will be explained in more detail below. The control unit 1 further serves to interface the data storage and retrieval device with an external device (not shown), such as a computer or even another data storage and retrieval device, via ADDRESS IN, DATA IN, and DATA OUT terminals. By this interfacing, control signals and data from the external device can be transmitted to and decoded by the control unit 1 using necessary protocols. The control unit 1 can develop control responses and data and return the data to the external device using the necessary protocols. It is contemplated that the control unit 1 can be interfaced with the external device via, for example, electrical or optical links. For instance, optical transmission into and out from the control unit 1 can be accomplished using electrically pumped laser diodes.

The spin polarized electron source 40, including tip 2b, provides spin-polarized electrons 3. In particular, the spin-polarized electrons 3 are developed by the spin polarized electron source 40 and are collected in the tip 2b. Tip 2b is a modulated self-polarizing sharp tip for emission of low energy electrons, as described in more detail later in the application.

Each of the spin-polarized electrons 3 has an electron magnetic field with a direction of polarization determined by the electron's spin. The direction of polarization of the electron magnetic field corresponds to one of first and second data values. For example, an upwardly polarized electron magnetic field can correspond to a data value of "1" while a downwardly polarized electron magnetic field can correspond to a data value of "0", or vice versa.

A potential $V_1$ is applied to the spin-polarized electron source 40 by the control unit 1. The strength of the potential $V_1$ can be varied by the control unit 1 to control the intensity, which is also known in the art as current, of the spin-polarized electrons 3. A signal $S_{19}$ is also applied to the spin-polarized electron source 40 by the control unit 1. Signal $S_{19}$ controls the direction of polarization of the magnetic fields of the spin-polarized electrons 3. Preferably, the control unit 1 can vary the potential $V_1$ and signal $S_{19}$ during operation of the device to compensate for factors, such as physical changes in the device and its environment over time, alternative configurations of the device, or alternate media characteristics of the device.

The extractor 4, collimators 6, 7 and 9, electrostatic lenses 10–12, the blanking element 13, and the coarse and fine microdeflectors 14 and 15, respectively, each constitutes, for example, an electrically conductive annular member defining an aperture. The extractor 4 extracts the spin-polarized electrons 3 from the tip 2b and collimators 6, 7 and 9 collimate the spin-polarized electrons 3 into a spin-polarized electron beam 19. The electrostatic lenses 10–12 focus the spin-polarized electron beam 19 and the coarse and fine microdeflectors 14 and 15, respectively, direct the spin-polarized electron beam 19 toward the data storage layer 17.

The environment through which the spin-polarized electron beam 19 travels is preferably an electrically nonconductive and nonionizing environment such as a vacuum. It is contemplated, however, that the environment through which the spin-polarized electron beam 19 travels can be any number of other environments known in the art which would not degrade, but may enhance, passage of the spin-polarized electron beam 19 from the electron source 2 to the data storage medium 17.

As shown in FIG. 1, the tip 2b is positioned so as to be perpendicular to the plane of the surface of the extractor 4, at the center of the extractor 4 aperture, and juxtaposed at or near the extractor 4 surface. Preferably, the apertures of extractor 4 and collimator 6 are in the order of 1 micron and 100 microns in diameter respectively. However, larger or smaller diameters could also be used depending on the particular design of the data storage and retrieval device and the desired characteristics of the spin-polarized electron beam 19.

Insulating element 5, which comprises, for example, Si, or the like, is positioned between the extractor 4 and collimator 6 to separate their conductive surfaces. Preferably, the diameter of the aperture of insulating element 5 is slightly greater than the diameters of the apertures of extractor 4 and collimator 6 to reduce interaction of the insulating element 5 with electrostatic fields produced in and electrons passing through the apertures of extractor 4 and collimator 6. One of ordinary skill in the art would now appreciate that the size and configuration of extractor 4, collimator 6, and insulating element 5 would be driven, in part, by the energy level of the spin-polarized electron beam.

Potentials $V_2$ and $V_3$ are applied by the control unit 1 to the extractor 4 and collimator 6, respectively, to create an electrostatic field in the aperture of each. The position of the tip 2b relative to the electrostatic field produced in the aperture of extractor 4 induce the spin-polarized electrons 3 to jump from the tip 2b and pass through the aperture of extractor 4 to the aperture of collimator 6. Collimator 6 focuses the electrons into relatively parallel trajectories toward the data storage layer.

The potentials $V_2$ and $V_3$ can be adjusted by control unit 1 to obtain desired characteristics of the spin-polarized electrons 3 and the spin-polarized electron beam 19. Control of the potentials $V_2$ and $V_3$ can be performed during operation of the device to compensate for factors, such as physical changes in the device and its environment over time, alternative configurations of the device, or alternative media characteristics of the device.

Collimators 7 and 9 and insulating element 8, which can be similar or identical to extractor 4, collimator 6, and insulating element 5, respectively, constitute an optional lens stage to assist in collimating the spin-polarized electrons 3 into the spin-polarized electron beam 19. Collimators 7 and 9 and insulating element 8 can also be used to accelerate or decelerate the spin-polarized electrons 3 to obtain a desired beam energy.

The potentials $V_4$–$V_5$ can be adjusted by the control unit 1 to obtain desired characteristics of the spin-polarized electrons 3 and the spin-polarized electron beam 19. Control of the potentials $V_4$–$V_5$ can be performed during operation of the device to compensate for factors, such as physical changes in the device and its environment over time, alternative configurations of the device, or alternative media characteristics of the device.

After passing through collimator 9, the spin-polarized electron beam 19 passes through electrostatic lenses 10–12. Potentials $V_6$–$V_8$ are applied to the electrostatic lenses 10–12, respectively, by the control unit 1 to create electrostatic fields through the lens apertures. These electrostatic fields focus the spin-polarized electron beam 19 with a desired diameter, e.g., 1–25 nanometers. That is to say the desired diameter is, in part, limited by the deBroglie wavelength. The apertures of the electrostatic lenses 10–12 are preferably on the order of 10 to 100 microns in diameter but can be varied depending on the particular design of the data storage and retrieval device and the desired characteristics, e.g., intensity, beam shape, type of media targeted etc., of the spin-polarized electron beam 19. Furthermore, the thicknesses of the electrostatic lenses 10–12, their relative positions, and the potentials $V_6$–$V_8$ can be varied to obtain desired characteristics of the spin-polarized electron beam 19. Again, the potentials $V_6$–$V_8$ can be varied by the control unit 1 during operation of the device to compensate for factors, such as physical changes in the device and its environment over time alternative configurations of the device, or alternative media characteristics of the device. Further, the electrostatic lenses 10–12 can be replaced with fewer or more of such lenses. One of ordinary skill in the art would now appreciate that the size and configuration of extractor 4, collimator 6, and insulating element S would be driven, in part, by the energy level of the spin-polarized electron beam. Also, magnetic lenses can be used in place of, or in addition to, the electrostatic lenses 10–12, the extractor and the collimators 6, 7 and 9.

After passing through electrostatic lens 12, the spin-polarized electron beam 19 passes through the blanking element 13. As will be explained in more detail below, the blanking element 13 is an optional element which disables the effects of the spin-polarized electron beam 19. The preferred location of the blanking element 13 is above the coarse microdeflector 14, as shown in FIG. 1, to allow the spin-polarized electron beam 19 to achieve a steady state.

After passing through the blanking element 13, the spin-polarized electron beam 19 passes through the coarse microdeflector 14 and then the fine microdeflector 15. Preferably, the coarse microdeflector 14 comprises eight poles individually controlled by signals $S_2$–$S_9$ supplied by the control unit 1. Similarly, the fine microdeflector 14 also preferably comprises eight poles individually controlled by signals $S_{10}$–$S_{17}$ also supplied by the control unit 1. The coarse and fine microdeflectors 14 and 15, respectively, direct the spin-polarized electron beam 19 toward the data storage layer 17. The electro static voltage supplied to each pole in a micro deflector contributes to the electrostatic field within the deflector. By varying the voltages on the poles the trajectory of the beam can be changed as it passes through the micro deflector. Of course, as one of skill in the art would understand, the Electrostatic fields do not interact with the spin-polarization of spin-polarized electron beam 19. Additionally, one of skill in the art would also understand that magnetic fields are not used to alter the beam trajectory because they are too large. While the coarse microdeflector 14 bends the trajectory of the spin-polarized electron beam 19 toward a general area on the data storage layer 17, the fine microdeflector 15 further adjusts the trajectory of the spin-polarized electron beam 19 to direct the spin-polarized electron beam 19 at a specific portion of the data storage layer 17. By gradually bending the spin-polarized electron beam 19 in this manner, distortions and aberrations introduced into the spin-polarized electron beam 19 can be reduced. It is contemplated that the fine microdeflector 15 can enable positioning of the spin-polarized electron beam 19 to the atomic level on data storage layer 17. In other words, as manufacturing capabilities allow more and more precise fabrication of the materials disclosed herein, it is contemplated that electron beam 19 will be capable of being positioned to effect an area on storage layer 17 as small as the limit imposed by the deBroglie wavelength of the beam electrons. However, current micro fabrication capabilities limit the single bit storage area to areas larger than the deBroglie wavelength. Although the coarse and fine microdeflectors 14 and 15, respectively, have been described to comprise eight poles each, it is contemplated that the coarse and fine microdeflectors 14 and 15, respectively, can have other configurations known in the art. Further, the relative positions of the coarse and fine microdeflectors 14 and 15, respectively, and the data storage layer 17 can be determined as a function of X-Y axes scanning range of the spin-polarized electron beam 19. Also, magnetic deflection can be used in place of, or in addition to, the coarse and fine micro deflectors 14 and 15, respectively. However, electro static deflection is preferred because of the size of the magnetic field necessary to deflect spin-polarized electron beam 19.

Figure 2:
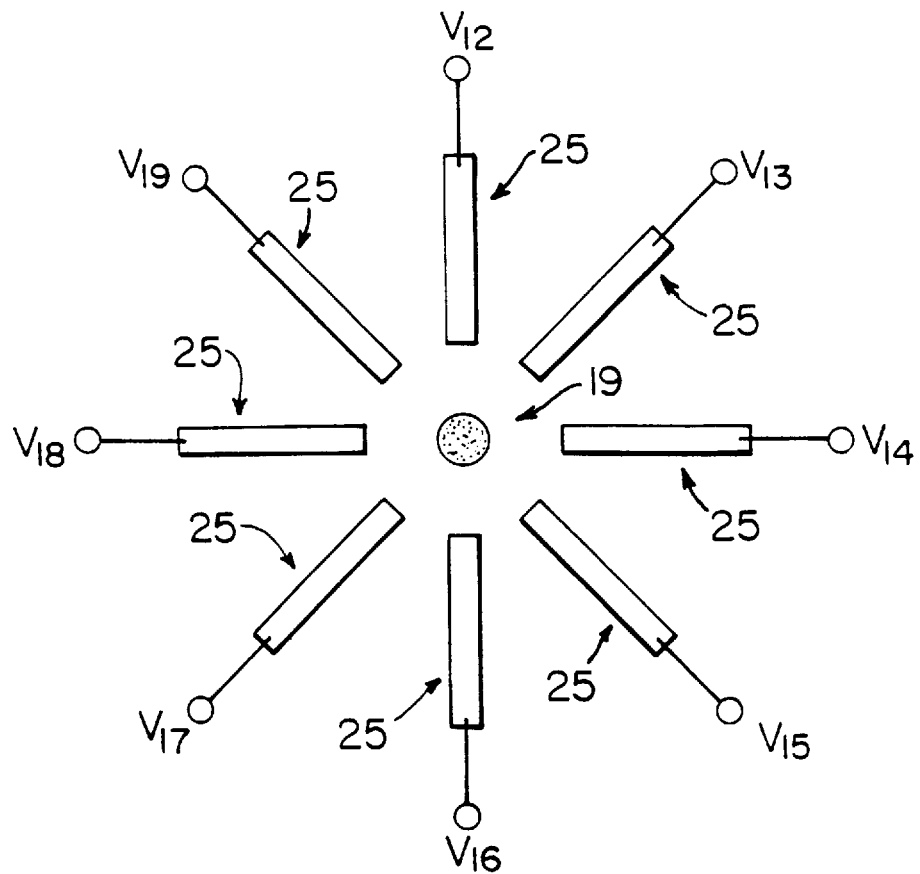
FIG. 2 is plan view of a stigmator element for use in the data storage and retrieval device of FIG. 1.

Although not shown in FIG. 1, the data storage and retrieval device can further comprise a stigmator element such as that shown in FIG. 2. Preferably, the stigmator element is positioned either between the electrostatic lens 12 and the blanking element 13 or between the blanking element 13 and the coarse microdeflector 14. As shown in FIG. 2, the stigmator element comprises, for example, an electrically conductive material generating an electrostatic field in the aperture formed by eight stigmator elements 25 individually biased with potentials $V_{12}$–$V_{19}$. It is contemplated that the stigmator element 25 can have other configurations known in the art. The individual potentials $V_{12}$–$V_{19}$ are applied to the stigmator poles of stigmator element 25 by the control unit 1 and are set during operation of the device to develop a field that results in a desired shape of the spin-polarized electron beam 19 and to compensate for factors, such as physical changes in the data storage and retrieval device and its environment over time alternative configurations of the device, or alternative media characteristics of the device. Although the stigmator element is generally used to provide the spin-polarized electron beam 19 with a round cross-sectional shape, the stigmator element can also be used to provide the spin-polarized electron beam 19 with a cross-sectional shape other than round, e.g. oval.

The electron detector 16 comprises an electrically conductive material, such as a metal, and is configured, for example, as shown in FIG. 1, to optimize the detection of electrons deflected from or secondary electrons emitted by the data storage layer 17. Preferably, the electron detector 16 is positioned so as not to interfere with the path of the spin-polarized electron beam 19 but close enough to the data storage layer 17 to detect the deflected or emitted electrons. Electrons striking the electron detector 16 produce a signal in the electron detector 16 which is supplied to the control unit 1 as signal $S_{18}$.

The data storage layer 17 and the substrate 18 together constitute a data storage medium. Preferably, the data storage layer 17 is deposited on the substrate 18 via, for example, sputtering, laser ablation, or other technique known in the art. The substrate 18 comprises a strain layer 29, a signal routing layer 30, and a non-magnetic and non-electrically conductive material, such as a glass or ceramic, that serves as a mechanical support for the data storage layer 17, strain layer 29, signal routing layer 30.

The data storage layer 17 comprises a fixed number of atomic layers of a ferromagnetic material (or equivalent), wherein the fixed number of atomic layers provides the data storage layer 17 with a magnetic vector perpendicular to its surface, i.e., its easy magnetic axis is out of plane due to strained interatomic distances imposed by strain layer 29. For example, in the case where the data storage layer 17 comprises Fe, three atomic layers of Fe arranged in a body centered tetragonal (bct) lattice provide the data storage layer with a strong Z-axis magnetic moment when deposited over a suitable strain layer such as, for example, Ir. Fe begins to shift, however, to a face centered cubic (fcc) lattice at numbers of atomic layers greater than three, which causes the magnetic anisotropy of the Fe atoms to shift to the X-Y plane. Similar results can also be achieved by combining Fe with certain dopants or alloying elements, such as Co or Ni or by varying the number of layers.

Figure 3A:
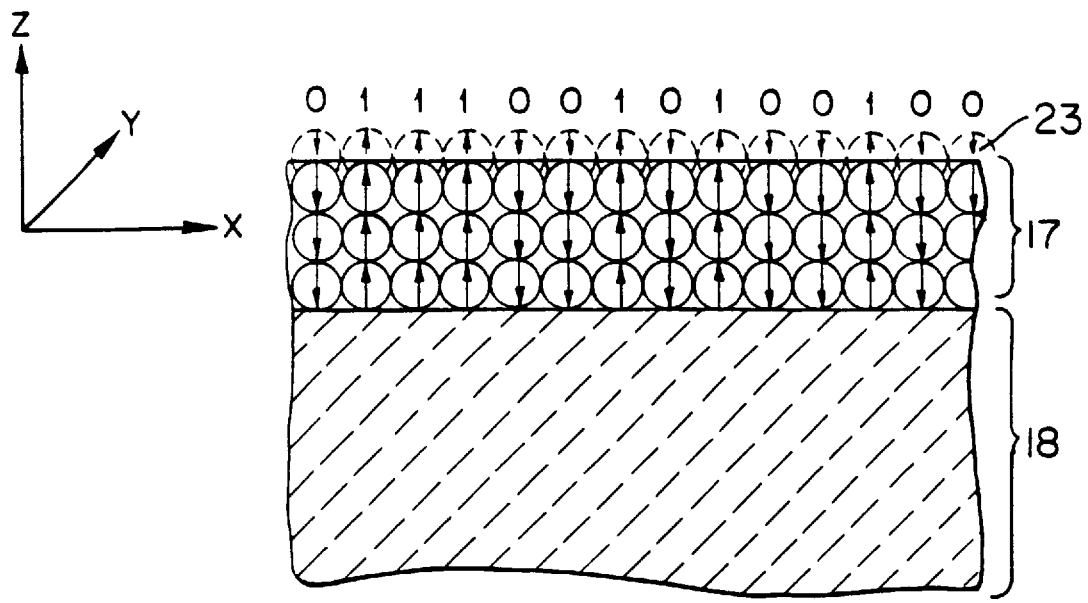
FIGS. 3(a) and 3(b) are partial cross-sectional views of the data storage medium of FIG. 1.

Because of the perpendicular magnetic anisotropy of the data storage layer 17, each lattice of atoms in the data storage layer 17 creates a data magnetic field having a polarization that extends along its easy axis, i.e., perpendicular to the surface of the data storage layer 17. These data magnetic fields are representatively shown in FIG. 3(a) as data magnetic fields 23. Like the magnetic fields produced by the spin polarized electrons 3, each data magnetic field created in the data storage layer 17 has a direction of polarization corresponding to one of first and second data values. For instance, an upwardly polarized data magnetic field can correspond to the data value of "1" while a downwardly polarized data magnetic field can correspond to the data value of "0", or vice versa. With this arrangement, portions of the data storage layer 17 store data in one of two states, i.e., first and second directions of magnetic polarity. It is contemplated that these portions of the data storage layer 17 can be as small as the limit imposed by the deBroglie wavelength of the beam electrons and the configuration of the deice, e.g., three atoms wide by three atoms thick.

Figure 4A:
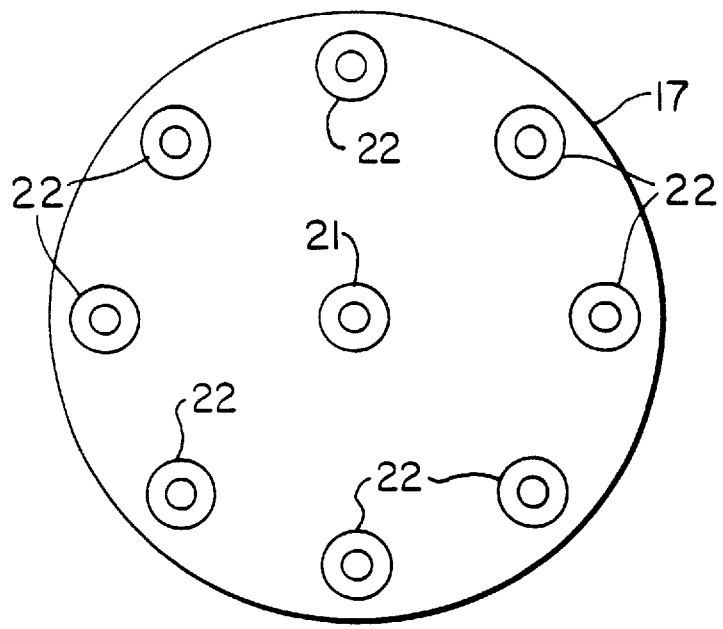
FIG. 4(a) is a plan view of the data storage medium of FIG. 1.
Figure 4B:
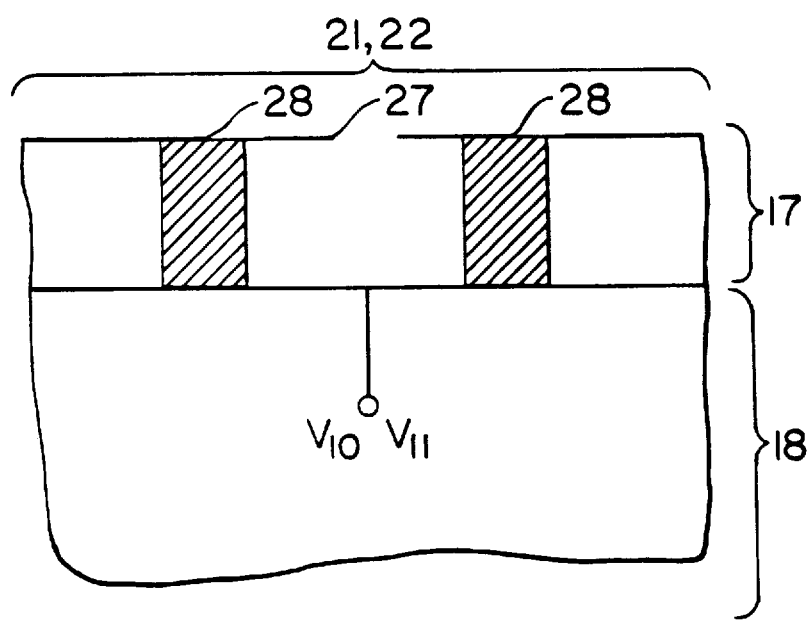
FIG. 4(b) is a partial cross-sectional view of the data storage medium of FIG. 1 showing parking and alignment areas.

As shown in FIGS. 4(a) and 4(b), the data storage layer 17 includes a plurality of alignment areas 22 and a parking area 21. Each of the alignment areas 22 and the parking area 21 comprises an electrically conductive material 27 electrically insulated from the data storage layer 17 by an insulator 28. The alignment areas 22 and parking area 21 are used for performing beam alignment, parking, and blanking operations, which will be described in more detail below. Potential $V_{10}$ of the parking area 21 and potential $V_{11}$ of the alignment areas 22 are detected by the control unit 1, as shown in FIG. 1.

Preferably, the data storage layer 17 has a planar surface. It is contemplated that the data storage medium can have any number of surface shapes, a three dimensional curved surface, to allow all points on the data storage layer to be approximately equidistant from the center of the fine aperture, thereby reducing average electron travel time and providing a uniform beam depth of focus across the surface of the data storage layer.

Figure 5A:
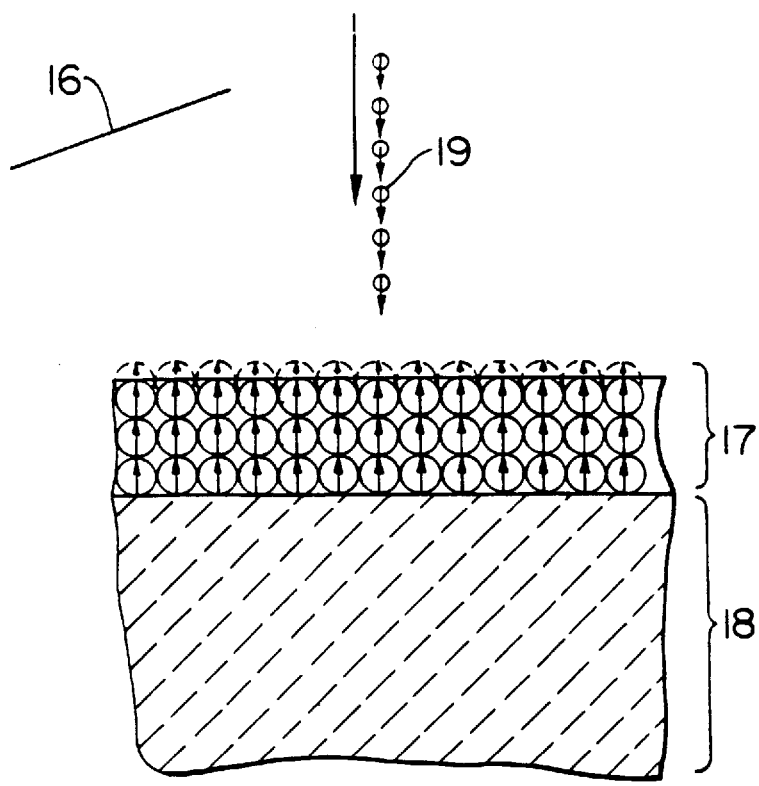
FIGS. 5(a)–5(b) are partial cross-sectional views of the data storage medium of FIG. 1 during a data store operation.
Figure 5B:
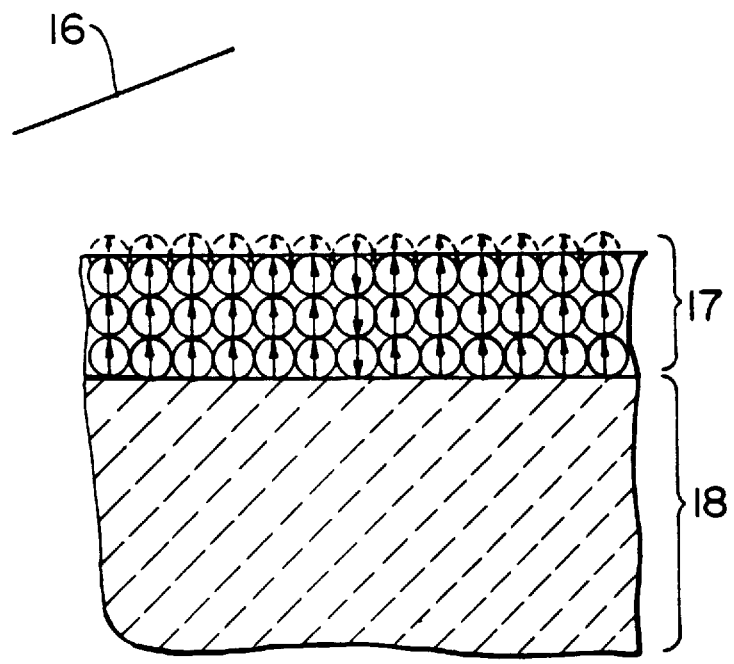

The storing of data in the data storage and retrieval device of FIG. 1 is accomplished as follows. Controller 1 receives an address signal and a data-in signal. The spin-polarized electron source 40 provides the spin-polarized electrons 3 with a direction of polarization corresponding to one of a first and second data value, depending on the data-in signal. Next, the extractor 4 extracts the spin-polarized electrons 3 from the tip 2b, the collimators 6, 7 and 9 collimate the spin-polarized electrons 3 into the spin-polarized electron beam 19, and the electrostatic lenses 10–12 focus the spin-polarized electron beam 19. A shown in FIG. 5(a), the spin-polarized electron beam 19 is directed by the microdeflectors 14 and 15 at a data magnetic field created in the portion of the data storage layer 17 at which data is to be stored. Controller 1 uses the address signal to determine the portion at which data is to be stored. As shown in FIG. 5(b), upon striking the data magnetic field with the correct wavelength, the spin-polarized electron beam 19 impinges the surface of the data storage layer 17 causing a cascading field reversal effect along the easy axis of magnetization producing the data magnetic field. As a result, the direction of polarization of the electrons in the spin-polarized electron beam 19 are imparted to the data magnetic field.

To achieve the desired cascading field reversal effect, the wavelength of the electrons in the spin-polarized electron beam 19 should be set in accordance with the material used for the data storage layer 17. In particular, the wavelength of the spin-polarized electron beam 19 should be approximately equal to the deBroglie wavelength of the electrons in the outer d subshell of the atoms of the material used for the data storage layer 17 causing the magnetization vector. In other words, the energy of the beam should be approximately equal to the kinetic energy of the electrons in the outer d subshell of the atoms of the material used for the data storage layer 17.

Figure 3B:
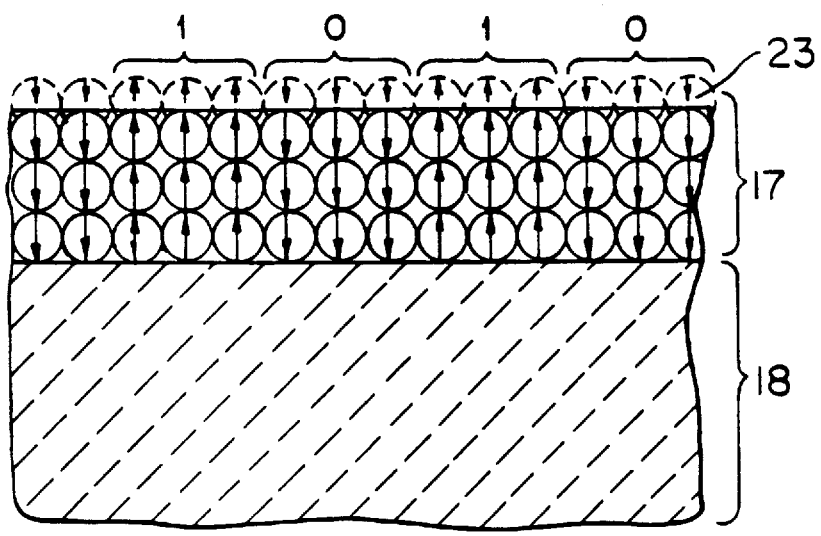

As explained above, it is contemplated that eventually a single data value will be stored on a portion of data storage layer 17 as small as the limit imposed by the deBroglie wavelength of the beam electron; however, current micro fabrication capabilities of data storage layer 17 require that the single data value be stored on portions of storage layer 17 somewhat larger than this minimum limit. However, it is also contemplated that portions of the data storage layer 17 are multiple atoms wide may also represent a single data value, as shown schematically in FIG. 3(b). If the atoms in the data storage layer 17 are grouped as such, the diameter of the spin-polarized electron beam electron beam 19 should be sized to accommodate the larger data storage areas.

The reading of data from the data storage layer 17 can be accomplished using one of two techniques. In the first data reading technique, controller 1 receives an address signal. The spin-polarized electron source 40 provides the spin-polarized electrons 3 with a direction of polarization corresponding to one of a first and second data value. Next, the extractor 4 extracts the spin-polarized electrons 3 from the tip 2b, the collimators 6, 7 and 9 collimate the spin-polarized electrons 3 into the spin-polarized electron beam 19, and the electrostatic lenses 10–12 focus the spin-polarized electron beam 19. The spin-polarized electron beam 19 is then directed by the microdeflectors 14 and 15 at a portion of the data storage layer 17 from which data is to be read. Controller 1 uses the address signal to determine the portion at which data is to be read.

Figure 6A:
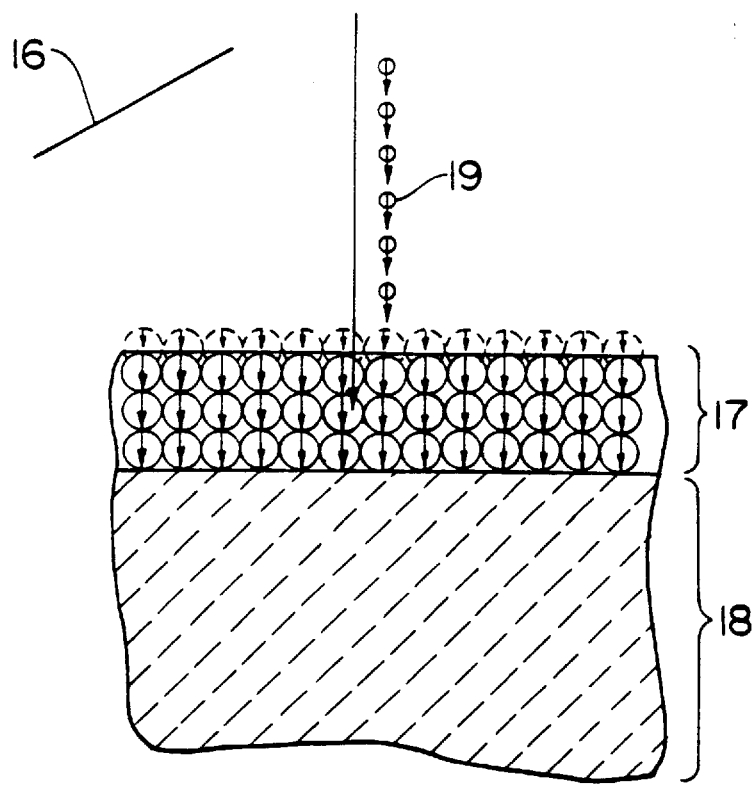
FIGS. 6(a)–6(b) are partial cross-sectional views of the data storage medium of FIG. 1 during a first data read operation.

As shown in FIG. 6(a), if the direction of polarization of the data magnetic field of the portion to be read is the same as the direction of polarization of the electrons in the spin-polarized electron beam 19, the electrons in the spin-polarized electron beam 19 are attracted by the data magnetic field and absorbed by the data storage layer 17. Absorption of the electrons by the data storage layer 17 results in the generation of a signal $S_{20}$.

Figure 6B:
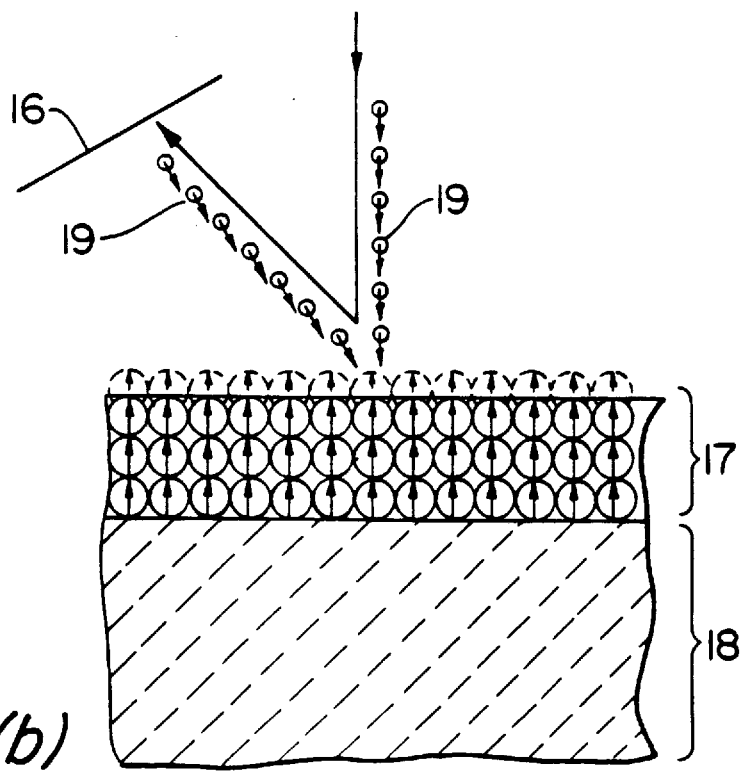

As shown in FIG. 6(b), if the direction of polarization of the data magnetic field is opposite the direction of polarization of the electrons in the spin-polarized electron beam 19, the electrons in the spin-polarized electron beam 19 are deflected by the data magnetic field and impinge upon the electron detector 16. As previously explained, impingement of the electrons upon the electron detector 16 results in the generation of the signal $S_{18}$.

Attraction of the electrons in the spin-polarized electron beam 19 by the data magnetic field is detected by the control unit 1 as a first data value, e.g., a data value of "0", while deflection of the electrons in the spin-polarized electron beam 19 by the data magnetic field is detected by the control unit 1 as a second data value, e.g., a data value of "1". Specifically, the control unit 1 detects and interprets the signal $S_{18}$, the signal $S_{20}$, or both the signal $S_{18}$ and the signal $S_{20}$ at a fixed time relative to the generation of the spin-polarized electrons 3 and, therefore, at a fixed time relative to the impact of the spin-polarized electron beam 19 with the data storage layer 17. If the signal $S_{18}$ is not detected and/or the voltage $V_{20}$ is detected by the control unit 1 a specified time after the generation of the spin-polarized electrons 3, the control unit 1 determines that the electrons in the spin-polarized electron beam 19 have been attracted by the data magnetic field and absorbed by the data storage layer 17. On the other hand, if the signal $S_{18}$ is detected and/or the signal $S_{20}$ is not detected by the control unit 1 a specified time after the generation of the spin-polarized electrons 3, the control unit 1 determines that the electrons in the spin-polarized electron beam 19 have been deflected by the data magnetic field and detected by the electron detector 16. Preferably, excess electrons in the data storage layer 17 are drained, for example, at the electrode producing signal $S_{20}$ while excess electrons in the electron detector 16 are drained, for example, at the electrode producing the signal $S_{18}$.

As was the case when storing data, when reading data from the data storage layer 17 using the first technique, the energy level of the spin-polarized electron beam 19 should be set in accordance with the material used for the data storage layer 17. However, when reading data using the first technique, the energy level of the spin-polarized electron beam 19 should be low enough so as not to cause a magnetic change to the data magnetic fields created in the data storage layer 17.

In the second data reading technique, the spin-polarized electron source 40 provides the spin-polarized electrons 3 with a direction of polarization corresponding to one of a first and second data value. Next, the extractor 4 extracts the spin-polarized electrons 3 from the tip 2b, the collimators 6, 7 and 9 collimate the spin-polarized electrons 3 into the spin-polarized electron beam 19, and the electrostatic lenses 10–12 focus the spin-polarized electron beam 19. The spin-polarized electron beam 19 is then directed by the microdeflectors 14 and 15 at a portion of the data storage layer 17 from which data is to be read.

In this second technique, the energy of the spin-polarized electron beam 19 is at a value higher than that for a data store operation and high enough such that the spin-polarized electron beam 19 penetrates into the portion of the data storage layer 17 causing that portion of the data storage layer 17 to produce secondary electrons. Preferably, the energy of the spin-polarized electron beam 19 should not be so high as to cause thermal migration of the atoms in the lattices of the data storage layer 17.

The secondary electrons produced by the data storage layer 17 have specific energy and spin which are characteristic of the relationship between the direction of polarization of the data magnetic field generated by the portion of the data storage layer 17 and the direction of polarization of the electrons in the spin-polarized electron beam 19. These secondary electron characteristics are detected as one of the first and second data values.

Figure 7A:
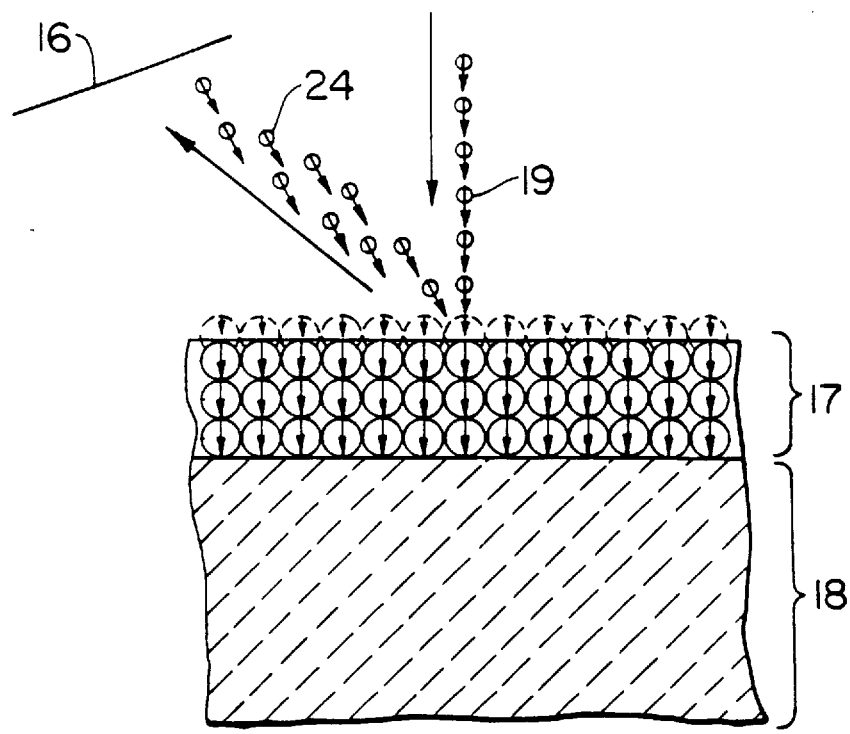
FIGS. 7(a)–7(b) are partial cross-sectional views of the data storage medium of FIG. 1 during a second data read operation.
Figure 7B:
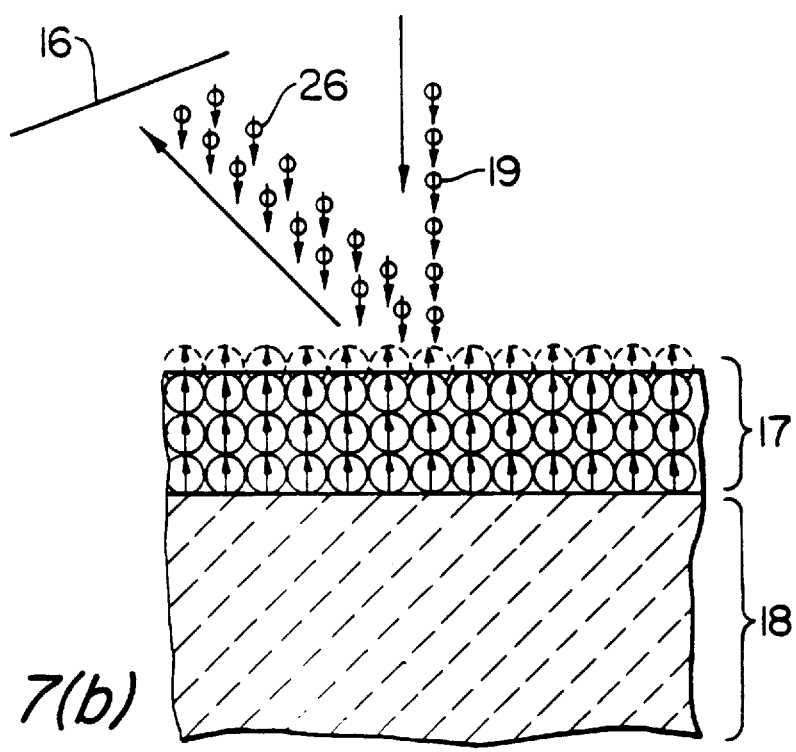

For example, as shown in FIG. 7(a), if the direction of polarization of the data magnetic field is the same as the direction of polarization of the electrons in the spin-polarized electron beam 19, the data storage layer 17 produces secondary electrons 24 having a first energy and first spin characteristics corresponding to the first data value, e.g., a data value of "1". Similarly, as shown in FIG. 7(b), if the direction of polarization of the data magnetic field is opposite the direction of polarization of the electrons in the spin-polarized electron beam 19, the data storage layer 17 produces secondary electrons 26 having a second energy and second spin characteristics corresponding to the second data value, e.g., a data value of "0". The secondary electrons produced by the data storage layer 17 are detected by the electron detector 16 to produce signal $S_{18}$ which indicates the secondary electron characteristics. The control unit 1, upon receiving the signal $S_{18}$, interprets the secondary electron characteristics.

Although this second technique has been described as detecting the energy and spin characteristics of the secondary electrons produced by the data storage layer 17, it is contemplated that other characteristics of the secondary electrons known in the art can be detected to read data stored on the data storage layer 17. Further, although most of the secondary electrons produced by the data storage layer 17 are emitted by the data storage layer 17, as shown in FIGS. 7(a) and 7(b), some of the secondary electrons remain within the data storage layer 17 to produce signal $S_{20}$. Thus, it is contemplated that the characteristics of the secondary electrons produced by the data storage layer 17 can also be detected and interpreted by the control unit 1 via signal $S_{20}$.

Figure 8:
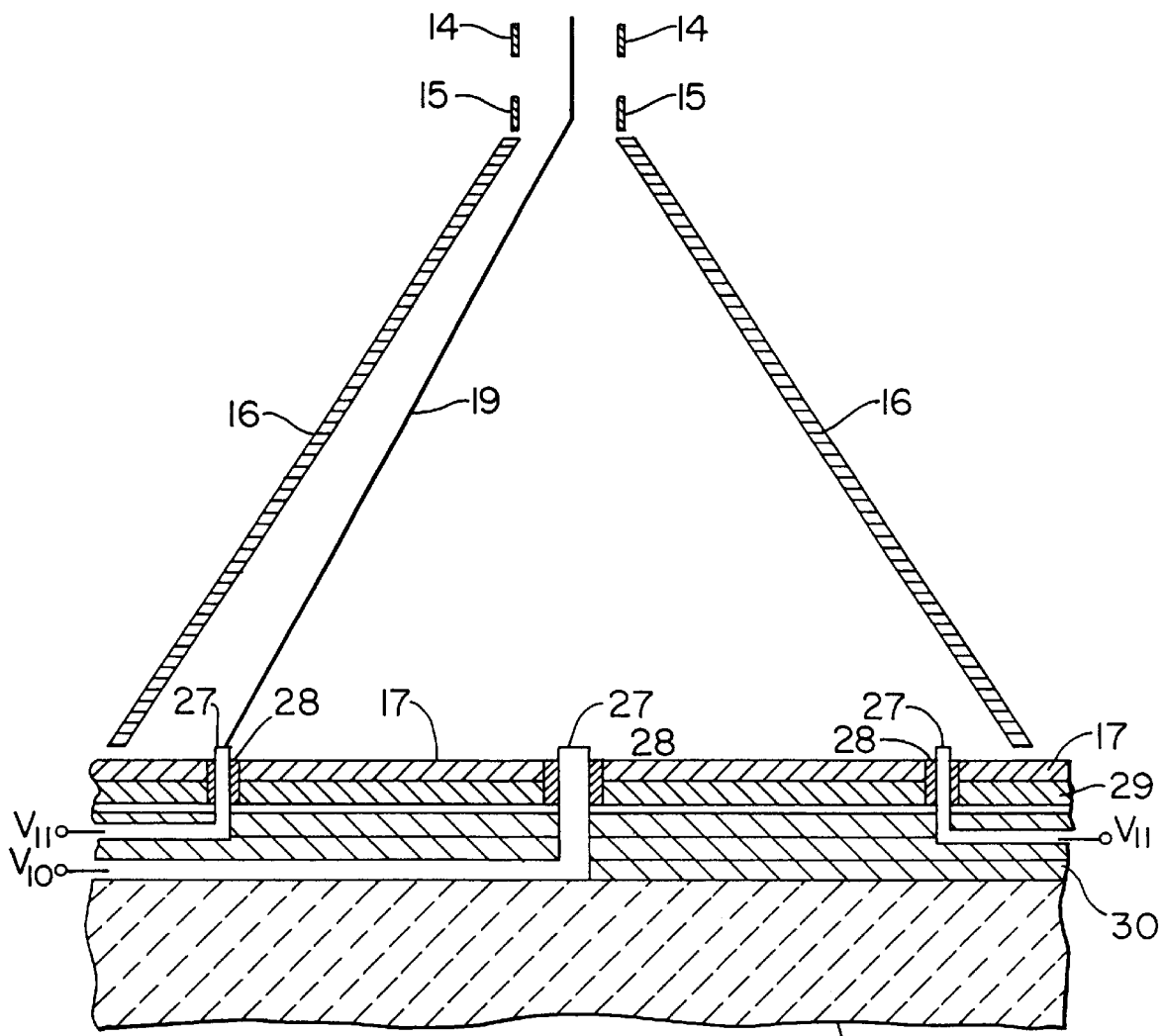
FIG. 8 is a partial cross-sectional view of the data storage and retrieval device of FIG. 1 during an alignment operation.

As shown in FIG. 8, alignment of the spin-polarized electron beam 19 is performed by directing the beam at one or more of the alignment areas 22. When the potential $V_{11}$ is detected by the control unit 1, the addressed and targeted alignment areas match. If the potential $V_{11}$ is not detected, signals $S_2$–$S_{17}$ to the microdeflectors 14 and 15 can be adjusted by the control unit 1 to compensate for any misalignment. Preferably, alignment of the spin-polarized electron beam 19 occurs periodically during operation of the device. Similarly, the alignment function can be performed by detecting patterns of bits stored at selected locations on the media. When the correct pattern has been detected, addressed and targeted areas match.

As described above, the blanking element 13, under control of the control unit 1, prevents the spin-polarized electron beam 19 from impinging the data storage layer 17. The blanking element 13 comprises, for example, two poles controlled with signal $S_1$. It is contemplated that blanking element 13 can have other configurations known in the art and that the poles can be individually controlled. The control unit 1 applies the signal $S_1$ to the blanking element 13 at a specific time and for a specific duration to blank the spin-polarized electron beam 19 while it is being moved by the microdeflectors 14 and 15 to target a different portion of the data storage layer 17. The blanking element 13 can also be used to blank the spin-polarized electron beam 19 during a data read operation when the control unit 1 is detecting whether or not electrons are being deflected or emitted by the data storage layer 17. The poles of the blanking element 13 act to diffuse the spin-polarized electron beam 19 so the electrons in the beam do not impinge the surface of the data storage layer 17 as a beam.

Figure 9:
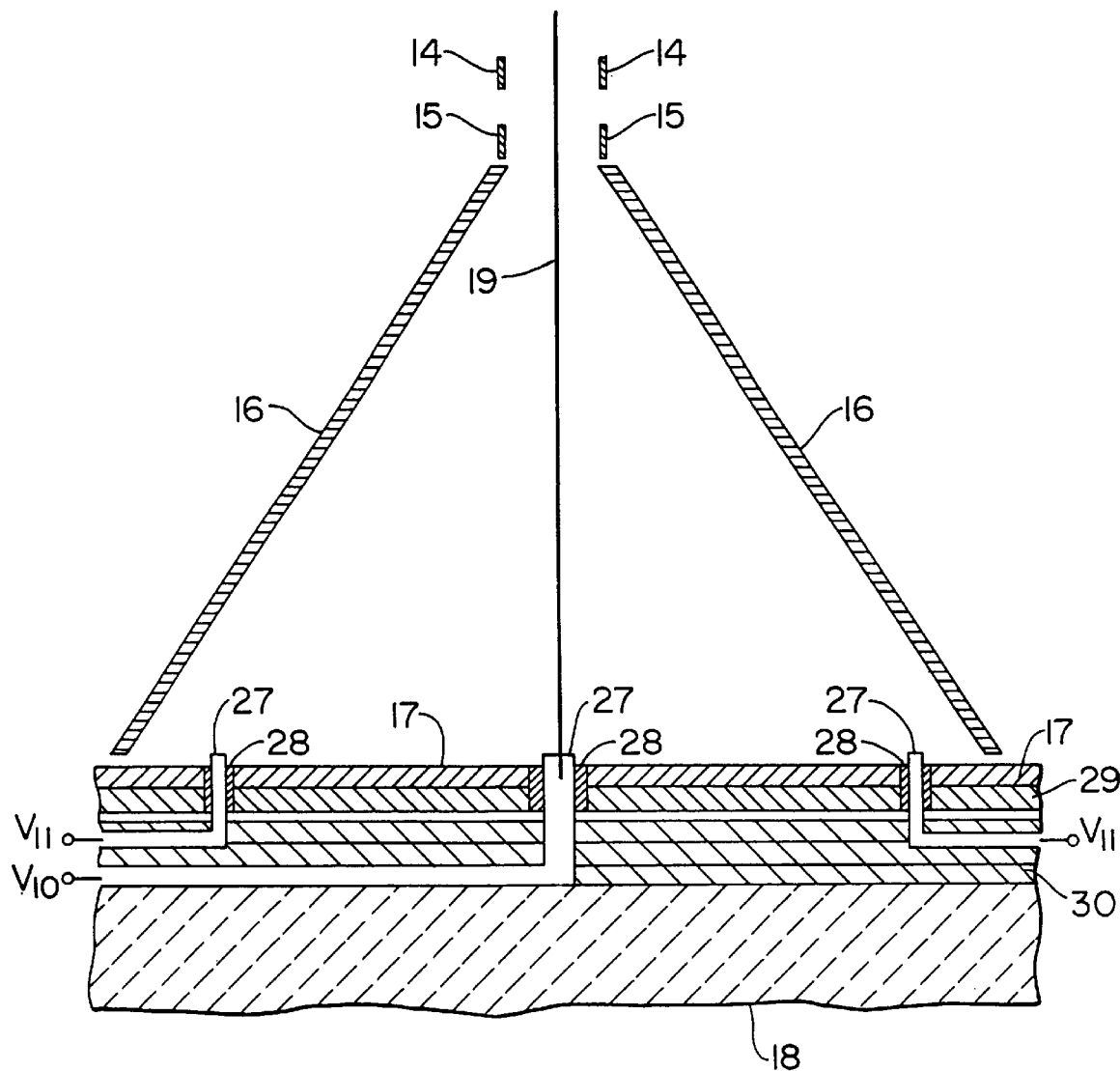
FIG. 9 is a partial cross-sectional view of the data storage and retrieval device of FIG. 1 during a blanking/parking operation.

It is contemplated that the microdeflectors 14 and 15 can alternatively be used to perform blanking of the spin-polarized electron beam 19 during data read operations. For example, the control unit 1 can supply the microdeflectors 14 and 15 with signals $S_2$–$S_{17}$ to cause the spin-polarized electron beam 19 to be directed at a particular area on the data storage layer 17 that is not used for data storage, e.g., parking area 21, as shown in FIG. 9. Impingement of the spin-polarized electron beam 19 on the parking area 21 is detected as the potential $V_{10}$ by the control unit 1.

Imperfections may exist in the data storage layer 17 as a result of fabrication, degradation, or other causes which render one or more flawed areas of the data storage layer 17 unusable for data storage. Accordingly, a format operation is provided to prevent the reading of data from and the storing of data to those flawed areas. For example, during the format operation, the control unit 1 cycles each data magnetic field created in the data storage layer 17 between up and down polarities at least once and verifies each result. This format operation can be performed, for example, by successively using the data read and data store operations described above. Control unit 1 determines whether certain portions of the data storage layer 17, from which written data cannot be reliably read, are unusable. Upon completion of the format operation, the locations of the unusable portions of the data storage layer 17 are stored in a memory which is maintained, for example, by the control unit 1 for use in determining where data can be stored during subsequent data storage operations.

It is contemplated that the format operation can detect and store locations of unusable portions of the data storage layer 17 during operation of the data storage and retrieval device. For example, after each store operation into a portion of the data storage layer 17, control unit 1 could then read from the portion, to verify that the portion is currently non-defective.

The control unit 1 can also use the memory to store locations of portions of the data storage layer 17 that are used for storing and protecting data which are read often but stored infrequently. Examples of this type of data stored in current storage mediums are configuration data and driver software stored in ROM. This type of data is stored in portions of the data storage layer 17 which are designated protected in the memory. As an additional precaution to preventing unintentional changes to protected data, certain portions of the data storage layer 17 can comprise an alternate material for data storage layer 17. This alternate material would require a different spin-polarized electron beam wavelength and/or intensity for storing data than that required by unprotected data locations. Thus, both access to the control unit 1 memory and modification of the spin-polarized electron beam wavelength and/or intensity would be required to change polarities of such protected data.

This spin-polarized electron beam has been illustrated with longitudinal spin polarization, however, transverse polarization can also be used. Transverse spin-polarization electron beam polarization requires that magnetic moments in the media be in plane and be parallel/antiparallel with the electron beam polarization and that magnetic coupling between storage areas be insufficient to interfere with beam/medium interactions.

An advantage attained by the described method and apparatus is elimination of all moving parts. However, it is contemplated that with the addition of certain mechanisms, the data storage layer could be made to move with respect to the beam. This movement could result in rotation of the data storage layer, the exchange of one data storage layer for another, or other implementations known in the art. Also, the beam formation apparatus can be made to move.

Potentials $V_2$–$V_8$ and $V_{12}$–$V_{19}$ and signals $S_2$–$S_9$, $S_{10}$–$S_{17}$, and $S_{19}$ preferably have adjustable bias components. These bias components are used to compensate for position misalignment, beam deformation, and correctable effects to the spin-polarized electron beam 19 caused by other elements. The bias component of an element modifies the effect of that element on the spin-polarized electron beam 19 by changing the intensity and shape of the field within the aperture of the element. Preferably, bias adjustments are performed by the control unit 1 during operation of the device. They occur in a specific order when the read and write functions are unable to determine or modify the polarity of a data magnetic field created in the data storage layer 17. The amount of bias compensation for each element is determined by adjustments needed to re-focus the intensity, wavelength, and cross-section of the spin-polarized electron beam 19 on the data storage layer 17 so that a known data magnetic field can be modified and read.

Figure 10:
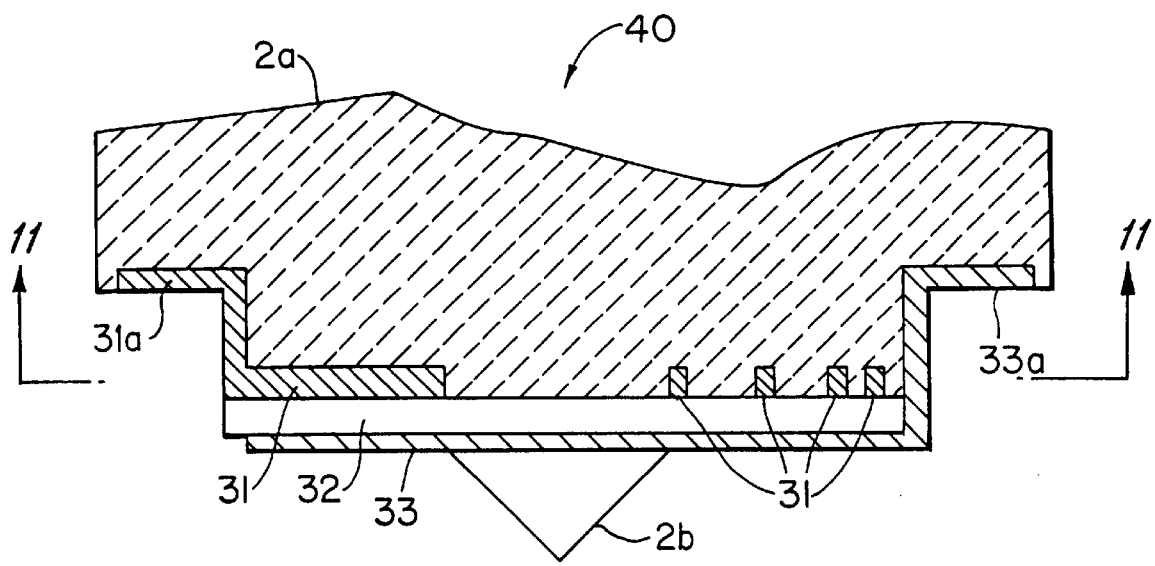
FIG. 10 is a side, cut-away view of the preferred electron emission device.

FIG. 10 shows the electron emission device 40 in more detail. Spin-polarized electron source 40 is a modulated self-polarizing sharp tip for emission of longitudinally polarized electrons, electrons having a spin axis parallel to the emission path. When used with a component, such as extractor 4, the electrons emitted by spin-polarized electron source 40 have a predominantly similar wavelength. Substrate 2a is for external mounting of the tip 2b and is the base component upon which remaining tip components are fabricated. Substrate 2a includes silicon dioxide ($SiO_2$), or another suitable material which electrically separates magnetizing layer 31 from conducting layer 33 and from extension 33a, the electrical contact for conducting layer 33.

Insulating layer 32, shown in FIG. 10, is adjacent to magnetizing layer 31 and extends past the edge of magnetizing layer 31 near magnetizing layer extension 31a. Insulating layer 32 includes $SiO_2$, or another suitable material which isolates the currents in magnetizing layer 31 and conducting layer 33.

Conducting layer 33 is an ultrathin film ferromagnetic material, such as Fe, deposited on insulating layer 32, by molecular beam epitaxy MBE or another method known in the art. Conducting layer 33 is preferably a single magnetic domain. Magnetizing layer extension 31a and conducting layer extension 33a are connected electrically to magnetizing layer 31 and conducting layer 33, respectively.

Figure 11:
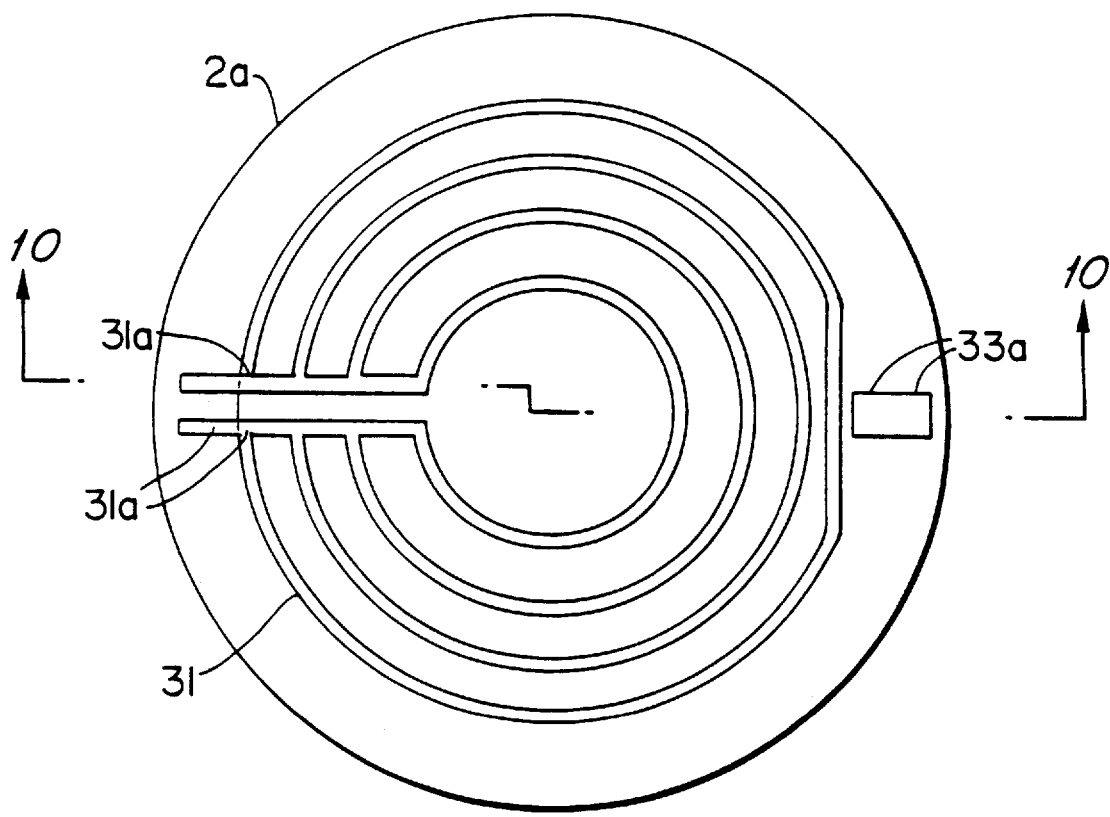
FIG. 11 is a bottom, cut-away view of the device shown in FIG. 10.

FIG. 11 shows a cut-away view of the electron emission device 40 viewed along the line 11—11 shown in FIG. 10. (FIG. 10 is a cut-away view along the line 10—10 shown in FIG. 11). Magnetizing layer 31 is a conductive metallic material, such as Al, Cu, or Au, deposited on substrate 2a through a suitable deposition technique. A lithographic process, such as MBE or chemical vapor deposition (CVD) can be used to form the layer in any suitable configuration. Magnetizing layer 31 includes a series of planar concentric rings with two out-of-plane electrical contacts for signal voltage $S_{19}$. However, other suitable configurations can also be used.

Figure 12:
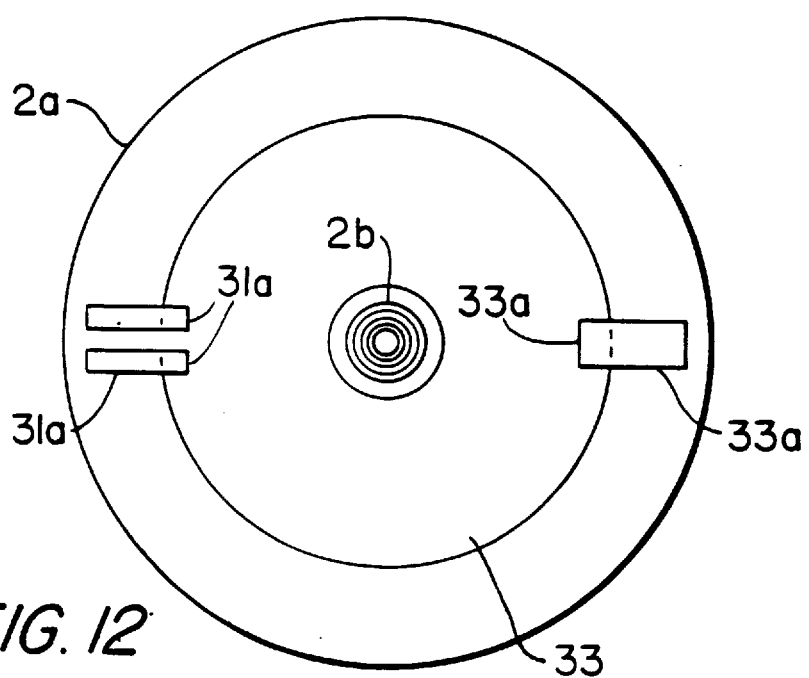
FIG. 12 is a bottom view of the device shown in FIG. 10.

FIG. 12 shows two electrical connection areas for signal $S_{19}$ on magnetizing layer extension 31a, an out-of-plane extension of magnetizing layer 31. An electrical connection area for source voltage $V_1$ is on conducting layer extension 33a, an out-of-plane extension of conducting layer 33 (See also FIG. 10). Electrical connections are soldered directly to magnetizing layer extension 31a and conducting layer extension 33a with indium solder or another suitable material known in the art.

The tip 2b is a sharp tip of conducting material that can be grown epitaxially, or by another suitable method known in the art, on conducting layer 33. An integral connection between the tip 2b and conducting layer 33 creates suitable electrical interface characteristics between conducting layer 33 and the tip 2b, reducing electron spin scattering while crossing the interface between layer 33 and tip 2b and a spin-derived variable impedance to the flow of spin-polarized electrons into the tip 2b consistent operational characteristics of the spin-polarized electron source 40 are better achieved. Thus, more electrons cross the interface with their polarization preserved.

No initial or external magnetization of the tip 2b or any other spin-polarized electron source 40 components is required. The signal $S_{19}$, which is a voltage of alternating [+] or [−] polarity, is connected to the two electrical connection areas of magnetizing layer extension 31a adjacent to the substrate 2a. A current $I_{19}$ flows through one electrical connection area of magnetizing layer 31, through the concentric rings, and out the second electrical connection area of magnetizing layer 31. Current $I_{19}$ establishes a magnetic field below and above the plane of the layer. This generated magnetic field extends perpendicularly through the insulating layer 32 and conducting layer 33. Conducting layer 33 is magnetized in a first direction as a result of the direction of current $I_{19}$ flow in magnetizing layer 31. After signal voltage $S_{19}$ is removed, conducting layer 33 will remain magnetized because it is a paramagnetic material. Signal voltage $S_{19}$ is an alternating polarity voltage that is controlled by controller 1 to be in phase with the in-progress device operation. When signal voltage $S_{19}$ is switched to the opposite polarity by controller 1, conducting layer 33 is magnetized in an opposite or second direction. It then remains magnetized in a second direction. Source current $I_1$ supplied to conducting layer 33 becomes polarized by the intrinsic magnetization of conducting layer 33 and by the magnetic field established by current $I_{19}$. The spin polarized current is extracted from the tip 2b at the sharp tip due to penetration of the sharp point of the tip by the electric field gradient from the extractor 4 at a point where the curvature of the tip 2b is greatest.

Current carriers in a crystal lattice can be electrons or holes. The following explanation describes electrons. The 3d subshell of an Fe atom has 5 electrons of one spin and a sixth electron of opposite spin. Electron spin develops a magnetic moment through intrinsic angular momentum that is separate from and approximately twice the magnitude of orbital angular momentum. Each electron has a resultant magnetic moment due to this intrinsic angular momentum. The moments align to form the atomic magnetic moment. The first 5 electrons in the 3d subshell of an Fe atom align their spin and resultant magnetic moments with the external field developed by magnetizing layer 31 and become parallel to it (within constraints of atomic electron orbital structure and lattice structure). The sixth spin is antiparallel to the first 5, canceling 1 electron magnetic moment. Current $I_1$ includes electrons having random spin. Therefore, when current flows through a planar thin film penetrated perpendicularly by an external magnetic field electrons in, the current become polarized spin. As a result, electrons flowing through conducting layer 33 are spin-polarized.

The components of the spin-polarized electron source 40 can be in any configuration to generate longitudinally spin-polarized electrons, provided the axis of magnetization through conducting layer 33, which polarizes spins, is juxtaposed longitudinally with the emitting surface. Alternatively, generation of transverse polarized electrons can be developed through fabrication of spin-polarized electron source 40 components in a configuration modified from the preferred embodiment. In this alternative embodiment, the axis of magnetization through a conducting layer is juxtaposed perpendicularly with the emitting surface.

In general, the spin-polarized electron source can be any source for providing spin-polarized electrons known in the art. The spin-polarized electron source 40 can be used as, for example, the tip of a scanning electron microscope or other similar device. Preferably, the tip has a small diameter, such as the diameter of a single atom.

Although a flat data storage layer 17 has been illustrated, it is contemplated that other shapes and configurations can be used. For example, the magnetic media can be segmented into an array of geometric formations such as tiles, cones, pyramids, cylinders, spheres, cubes, or other irregular shapes which may or may not be electrically isolated from each other. The geometric formations may have any shape, provided the magnetic axis of the electrons in the beam is parallel with the magnetic axis of the illuminated atoms in the geometric formation.

Figure 13:
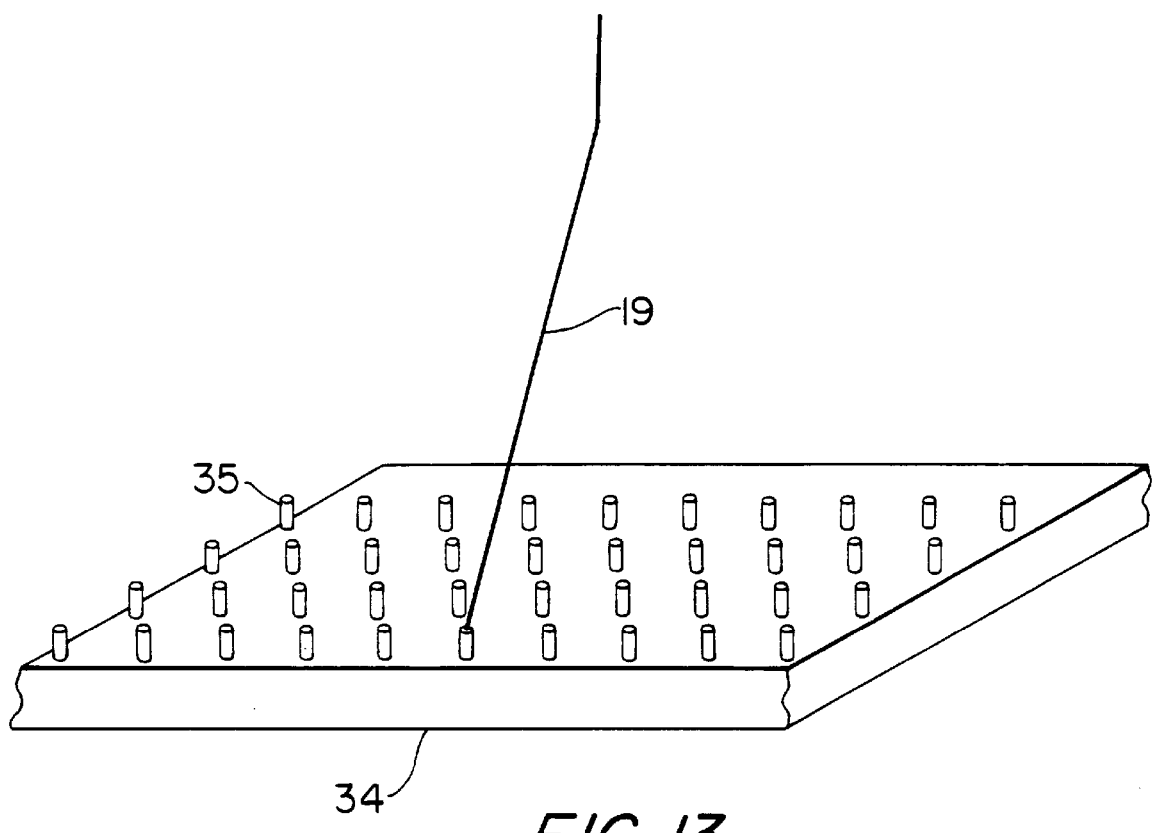
FIG. 13 is a diagram illustrating an alternative embodiment of the present invention.

FIG. 13 shows a portion of an alternative embodiment of the present invention. Cylinders 35 include a ferromagnetic material on a substrate 34. The easy magnetic axis of cylinders 35 can be longitudinal. This easy magnetic axis is oriented parallel with longitudinally spin polarized electrons in the beam 19 in order to polarize the magnetic axis of the cylinders 35.

As another alternative, the magnetic media could be cone-shaped formations deposited in a regular array on a surface. A magnetic axis of the cones could be parallel with the plane of the surface, requiring spin-polarized electrons that are transversely polarized in the beam to polarize the magnetic axis of the cones.

Although an Fe magnetic media has been illustrated, any multiple-electron metal with co-mingling ranges of binding energies of f or s subshell electrons with that of an outer d subshell and which can be made to exhibit ferromagnetism via a strained lattice structure, such as bct, in few atomic layers can be used as the magnetic media. Candidate metals for the magnetic media can be from the three periodic table transition series. For example, candidate metals from the 3d series can include Co and Ni. Similarly, candidate metals from the 4d and 5d series can include Mo and Ir, respectively. These metals function in a manner similar to a Fe magnetic media previously described.

Although the above disclosure is directed to a single electron beam it would be apparent to one of ordinary skill in the art that multiple electron beams could be incorporated into the device. In this alternative, the electron beam and the spin-polarized electrons would be directed at multiple portions of the member that correspond to the address signals transmitted to a control unit. Thus, devices consistent with the present invention would be capable of controlling the wavelength of multiple beam electrons such that multiple portions of a magnetic storage layer assume magnetic polarizations corresponding to the magnetic polarization of the beam electrons directed at that portion. The control unit would also include means responsive to address signals, for detecting the polarizations of multiple portions of the data storage layer corresponding to the address signals, by directing the beams at the multiple portions.

It should be apparent to those skilled in the art that various modifications and variations can be made to the present invention without departing from the spirit or scope of the invention. Thus, it is intended that the present invention cover the modifications and variations of this invention provided they come within the scope of the appended claims and their equivalents.

What is claimed is:

1. An electron emission device for generating and emitting spin-polarized electrons comprising:
   a first conducting material;
   a magnetic ultrathin film magnetically coupled to the first conducting material;
   an electrically insulative and magnetically permeable medium being located between the first conducting material and the magnetic ultrathin film;
   a second conducting material formed into a structure that emits electrons when impinged by an electric field and electrically coupled to the magnetic ultrathin film; and
   an anode, electrically coupled to the structure that emits electrons, for generating the electric field that impinges on the structure that emits electrons.

2. The device of claim 1, wherein the electric field is developed internally to the electron emission device.

3. The device of claim 1, wherein the structure that emits electrons is formed into a conical shape.

4. The device of claim 1, wherein the electrically insulative and magnetically permeable material is air.

5. The device of claim 1, wherein the electrically insulative and magnetically permeable material is a vacuum.

6. The device of claim 1, further comprising:
   a current source connected to the magnetic ultrathin film for supplying a flow of electrons to be spin-polarized; and
   means for varying the flow of electrons supplied by the current source.

7. The device of claim 6, wherein the means for varying the flow of electrons includes means to intermittently supply the flow of electrons.

8. The device of claim 6, wherein the means for varying is disabled during emission of spin-polarized electrons.

9. The device of claim 6, wherein the means for varying is enabled during emission of spin-polarized electrons.

10. The device of claim 1, wherein the first conducting material is formed into a structure that enhances impingement of a generated magnetic field in the magnetic ultrathin film.

11. The device of claim 1, wherein the first conducting material is formed into a plurality of coils.

12. The device of claim 1, further comprising:
    a voltage source connected to the first conducting material; and
    means for changing a polarity of the voltage source between one of a first polarity and a second polarity to polarize electrons in the magnetic ultrathin film in a polarization direction corresponding to the polarity of the voltage source.

13. The device of claim 12, comprising means for changing a magnitude of voltage supplied by the voltage source to vary a degree of polarization of electrons in the magnetic ultrathin film.

14. The device of claim 1, wherein the magnetic ultrathin film is strained.

15. The device of claim 1, further comprising:
    a current source connected to the magnetic ultrathin film for supplying a flow of electrons to be spin-polarized;
    means for varying the flow of electrons supplied by the current source;
    a voltage source connected to the first conducting material; and
    means for changing a polarity of the voltage source between one of a first polarity and a second polarity to polarize electrons in the magnetic ultrathin film in a polarization direction corresponding to the polarity of the voltage source.

16. The device of claim 15, further comprising means for changing a magnitude of voltage supplied by the voltage source to vary a degree of polarization of electrons in the magnetic ultrathin film.

17. The device of claim 15, wherein the means for changing the polarity of the voltage source controls the polarity of a magnetic field generated by the first conducting material.

18. The device of claim 17, wherein the polarity of the magnetic field controls the polarization direction of the polarized electrons in the magnetic ultrathin film.

19. The device of claim 16, wherein the voltage source can be disconnected.

20. The device of claim 16, wherein the voltage source can be enabled during the emission of spin-polarized electrons.

21. The device of claim 16, wherein the voltage source is disabled to reduce the degree of polarization of the emitted electrons.

22. The device of claim 17, wherein the means for changing the polarity of the voltage source includes means for intermittently supplying a voltage.

23. The device of claim 17, wherein the magnetic field is developed internally to the electron emission device.

24. The device of claim 12, wherein the means for changing the polarity includes:

means for receiving a polarity signal; and means for controlling the means for changing the polarity to change the polarity of the magnetic ultrathin film based on the received polarity signal.

25. A method for generating and emitting spin-polarized electrons comprising the steps of:

supplying a voltage to a first conducting material to establish a magnetic field polarity;

polarizing electrons in a magnetic ultrathin film based on the magnetic field polarity;

supplying a current to the magnetic ultrathin film to supply a flow of electrons to be spin-polarized in the magnetic ultrathin film;

emitting polarized electrons by subjecting a second conducting material, formed into a structure that emits electrons, to an electric field.

26. The method of claim 25, wherein the step of supplying a voltage comprises:

changing the voltage between a first polarity and a second polarity.

27. The method of claim 26, further comprising the step of:

controlling the flow of the polarized electrons based on the current supplied to the magnetic ultrathin film.

28. The method of claim 26, further comprising the step of:

controlling the energy level of the emitted electrons by varying the strength of the electric filed.

29. The method of claim 26, further comprising the step of:

switching the polarization of the emitted electrons.

* * * * *